(12) United States Patent
Sander

(10) Patent No.: US 6,876,043 B1
(45) Date of Patent: *Apr. 5, 2005

(54) TEMPERATURE-PROTECTED SEMICONDUCTOR SWITCH

(75) Inventor: Rainald Sander, Munich (DE)

(73) Assignee: Infineon Technologies AG, Münich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/497,618

(22) Filed: Feb. 3, 2000

(30) Foreign Application Priority Data

Feb. 4, 1999  (DE) .......................................... 199 04 575

(51) Int. Cl.[7] .............................................. H01L 29/76
(52) U.S. Cl. ...................................................... 257/378
(58) Field of Search ................................ 257/112, 117, 257/423, 427, 417, 444, 577, 378, 288, 470; 307/117, 112

(56) References Cited

U.S. PATENT DOCUMENTS

| | | | | |
|---|---|---|---|---|
| 4,730,228 A | * | 3/1988 | Einzinger et al. ............ | 361/103 |
| 5,107,216 A | * | 4/1992 | Yabusaki et al. ............ | 324/318 |
| 5,461,252 A | * | 10/1995 | Nakura et al. ............... | 257/470 |
| 5,500,547 A | * | 3/1996 | Yamaguchi et al. ......... | 257/359 |
| 5,521,421 A | * | 5/1996 | Furuhata ...................... | 257/467 |
| 5,726,478 A | * | 3/1998 | Gantioler et al. ............ | 257/355 |
| 6,373,100 B1 | * | 4/2002 | Pages et al. ................. | 257/343 |

FOREIGN PATENT DOCUMENTS

| | | |
|---|---|---|
| EP | 0 341 482 | 11/1989 |
| JP | 404186763 A | * 7/1992 |

OTHER PUBLICATIONS

Charles H. Roth, Jr., Fundamentals of Logic Design 1992, West Publishing Company, Fourth Edition, p. 51.*

* cited by examiner

*Primary Examiner*—Long Pham
*Assistant Examiner*—Dana Farahani
(74) *Attorney, Agent, or Firm*—Schiff Hardin LLP

(57) ABSTRACT

A temperature-protected semiconductor switch having a semiconductor switch element composed of a number of cells connected in parallel and an integrated reverse diode, and further having a temperature sensor wherein the semiconductor switch element and the temperature sensor are integrated together in a semiconductor body of a first conductivity type. Upon occurrence of an excess temperature, the temperature sensor generates a first signal. A charge carrier detector is also provided which generates a second signal given the occurrence of free charged carriers caused by the integrated reverse diode in the semiconductor body. The first and second signals are supplied to an evaluation means that, for examples, undertakes the shut-off of the semiconductor switch only in the case of a true excess temperature.

9 Claims, 3 Drawing Sheets

PRIOR ART FIG 1A
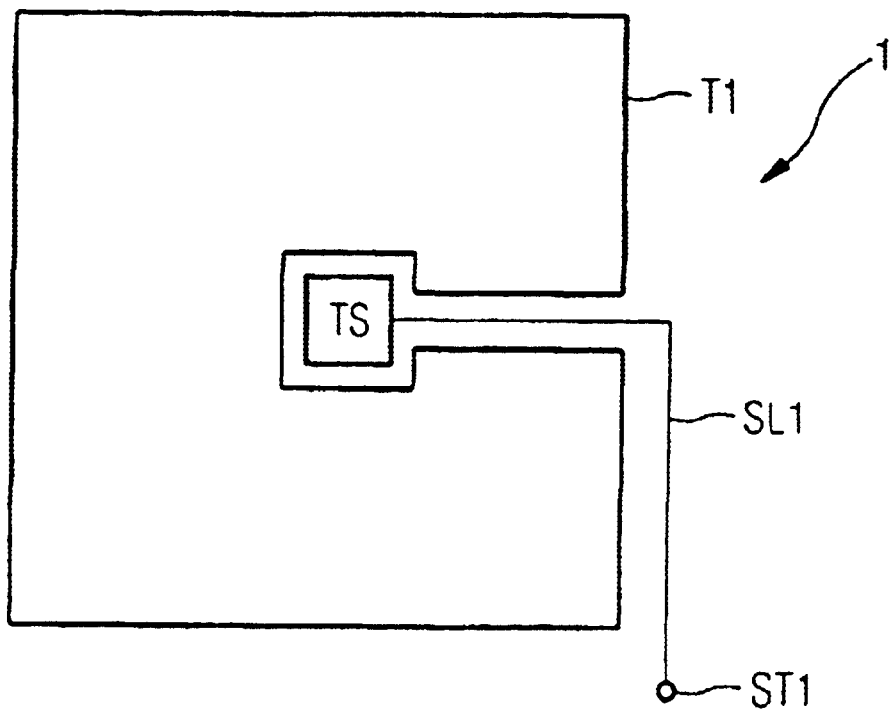
PRIOR ART FIG 1B
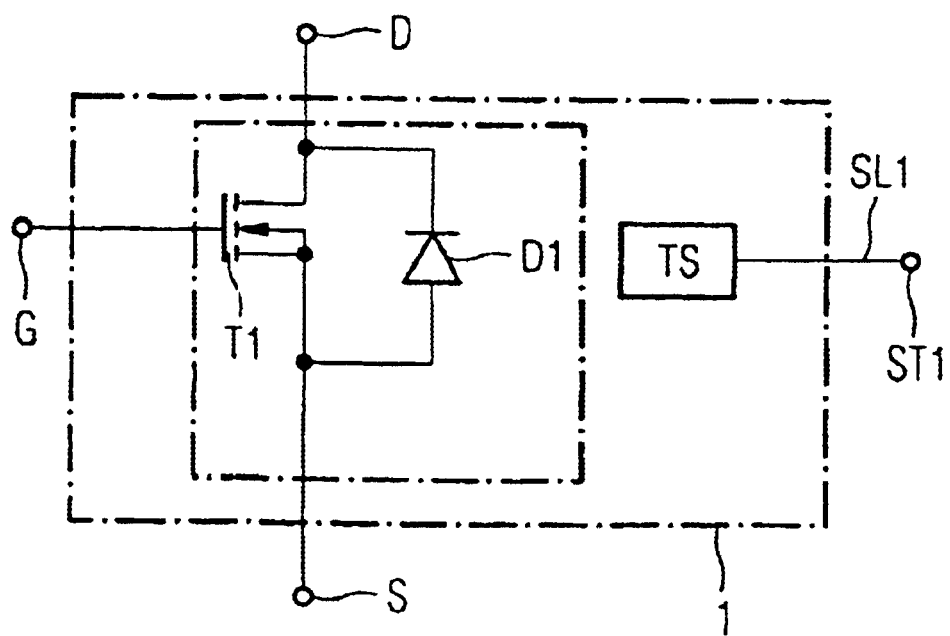

TEMPERATURE-PROTECTED SEMICONDUCTOR SWITCH

BACKGROUND OF THE INVENTION

1. Field of the Invention

The present invention is directed to a temperature-protected semiconductor switch having a semiconductor switch element which is composed of a number of cells connected in parallel and which includes an integrated reverse diode. The temperature-protected semiconductor switch also has a temperature sensor wherein the semiconductor switch element and the temperature sensor are integrated together in a semiconductor body of a first conductivity type and wherein the temperature sensor generates a first signal given the occurrence of an excessive temperature.

2. Description of the Prior Art

For protection against thermal overload, semiconductor switches, particularly power switches, are provided with integrated temperature sensors. The temperature sensors acquire the temperature of the power switch and convert this into a temperature-dependent, analog signal which then can be interpreted in a circuit. As a result thereof, for example, a shut-off of the semiconductor switch is possible when a specific, predetermined temperature has been exceeded.

FIG. 1a shows a schematic view of such a semiconductor switch. The semiconductor switch 1 is thereby composed of a semiconductor switch element T1, for example a MOSFET, that includes a number of cells (not shown) connected in parallel. A temperature sensor TS is integrated in the proximity of the hottest location; this being potentially implemented, for example, as a diode, a bipolar transistor or, on the other hand, as a thyristor. The temperature sensor TS together with the semiconductor switch element T1 is integrated in a semiconductor body. Via a signal line SL1, the temperature sensor TS outputs a signal when a predetermined temperature is upwardly exceeded, this signal being processed by an evaluation unit (not shown). The signal then can be taken to shut the semiconductor switch element T1 off. As a result, an overheating and, thus, a destruction of the semiconductor switch element T1 can be avoided. FIG. 1b shows the schematic circuit diagram of the semiconductor switch element T1, a MOSFET, and of the temperature sensor TS. Due to technology, a MOSFET includes an integrated reverse diode D1. Many versions are known for the interconnection of a temperature sensor TS with the semiconductor switch element so that only a block symbol is shown for the temperature sensor; this being connected to a status output ST1 via the signal line 1. A circuit arrangement for acquiring the excess temperature of a semiconductor switch in integrated form is disclosed, for example, by EP 0 341 482 A1.

When the temperature sensor together with the semiconductor switch element is integrated in a semiconductor body, the technologically integrated diode can present problems for the semiconductor switch element from source to drain. When this is operated statically or temporarily in flow direction, it produces free charge carriers. The free charge carriers form a parasitic structure together with the integrated temperature sensor. This can lead to the fact that the temperature sensor assumes it has detected an excess temperature and, thus, outputs a signal to the evaluation. This case can occur, for example, when respectively two temperature-protected high-side and low-side switches are interconnected to form a H-bridge and when a motor represents the load. Since the motor represents an inductance, reactance currents can activate the integrated reverse diode and produce free charge carriers.

In order to prevent this undesired condition, it is known to integrate the temperature sensor with a suitable, permanently implanted charge carrier diffusion that annularly surrounds the temperature sensor. The emitted charge carriers can be captured by applying a voltage between the charge carrier diffusion and the integrated reverse diode. As a result thereof, the temperature sensor is protected against the penetration of charge carriers. The charge carrier diffusion rings, which are also referred to as "suction rings", however, have only a limited effect given high currents through the integrated reverse diode. In order also to be able to capture the charge carriers given high currents, the charge carrier diffusion would have to be implemented extremely broad. This, however, would have the disadvantageous effect that the temperature sensor exhibits a relatively great distance from the hottest location of the semiconductor switch element. It is precisely in semiconductor switches with a high current density, however, that the reaction time of the temperature sensor given thermal overload of the semiconductor switch element is of great significance. When, on the other hand, the charge carrier diffusion is implemented too low, this cannot adequately efficiently protect the temperature sensor given extremely high currents through the reverse diode D1 in order to prevent the undesired, parasitic effects to the temperature sensor.

Proceeding on the basis of this prior art, therefore, an object of the present invention is to provide a temperature-protected semiconductor switch that enables the response of the temperature sensor in a simple way only in case of an excess temperature.

SUMMARY OF THE INVENTION

In the temperature-protected semiconductor switch of the present invention, such object is achieved in that a charge carrier detector is provided which generates a second signal given the occurrence of free charge carriers in the semiconductor body.

The charge carrier detector is advantageously designed such that a parasitic component is formed between the charge carrier detector, the semiconductor body and at least one cell of the semiconductor switch element. When free charge carriers are produced, this parasitic structure enables the integrated reverse diode to generate a signal. When the first and second signals are supplied for evaluation and are logically operated with one another thereat, then the indication of an unambiguous excess temperature in the semiconductor switch element is dependably produced.

In an embodiment, the charge carrier detector is arranged neighboring the temperature sensor which is, in turn, applied in the proximity of the hottest location of the semiconductor switch. Ideally, the charge carrier detector is arranged neighboring a signal line of the temperature sensor that leads out of the semiconductor switch. In this case, a signal line of the charge carrier detector can be conducted out of the semiconductor switch spatially adjacent to the signal line of the temperature sensor. A particularly simple layout of the semiconductor switch is thus possible since only a few modifications need be undertaken compared to a semiconductor switch known from the prior art.

In an embodiment, the evaluation means can be integrated together with the semiconductor switch, wherein it is monolithically integrated in the same semiconductor body. In this case, an advantageous space-arrangement of the temperature-protected semiconductor switch is possible. Of course, it is also conceivable to accommodate the evaluation means in a separate semiconductor chip and, for example, to apply this on the semiconductor switch with a chip-on-chip mounting.

Additional features and advantages of the present invention are described in, and will be apparent from, the Detailed Description of the Preferred Embodiments and the Drawings

DESCRIPTION OF THE DRAWINGS

FIG. 1a shows a schematic plan view onto a temperature-protected semiconductor switch of the prior art;

FIG. 1b shows the circuit diagram associated with the semiconductor switch of FIG. 1a;

DETAILED DESCRIPTION OF THE PREFERRED EMBODIMENTS

Figure 2:
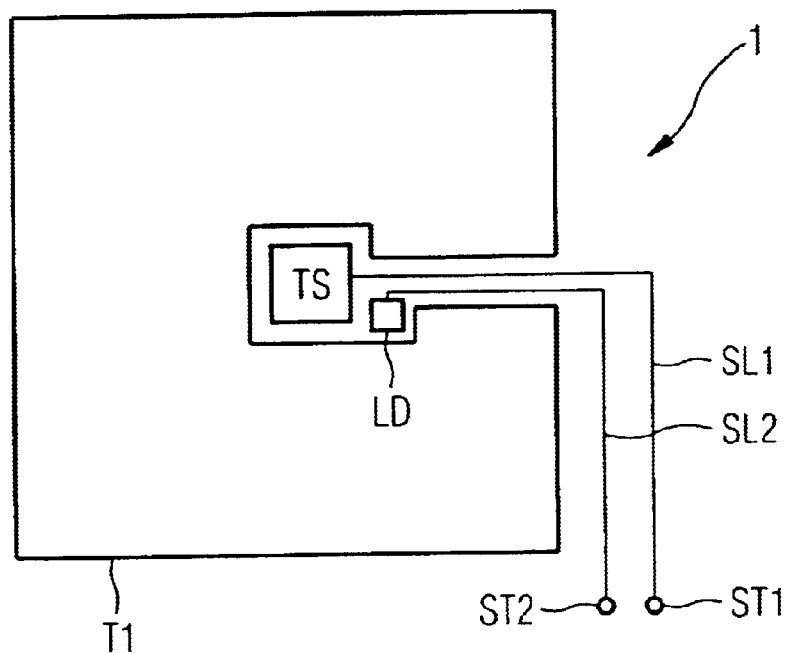
FIG. 2 shows a schematic plan view onto the temperature-protected semiconductor switch of the present invention.

FIG. 2 shows a schematic plan view onto the inventive, temperature-protected semiconductor switch 1. This is composed of a semiconductor switch element T1 that is, in turn, composed of a number of MOS cells (not shown) connected in parallel. A temperature sensor TS is attached in the proximity to the hottest location of the semiconductor switch element TS1, the temperature sensor TS outputting a signal via a signal line SL1 to a status output ST1 when a predetermined temperature threshold is upwardly exceeded. A charge carrier detector LD is arranged neighboring the temperature sensor TS, this detector LD likewise including a signal line SL2 that is connected to a status output ST2. The charge carrier detector LD is thereby arranged neighboring the temperature sensor TS, whereby the preferred location exists close to the junction of the signal line SL1 and the temperature sensor TS. The charge carrier detector LD, of course, could be arranged at any arbitrary location in the semiconductor switch element T1. The illustrated embodiment, however, represents the form that is simplest to produce.

Figure 3:
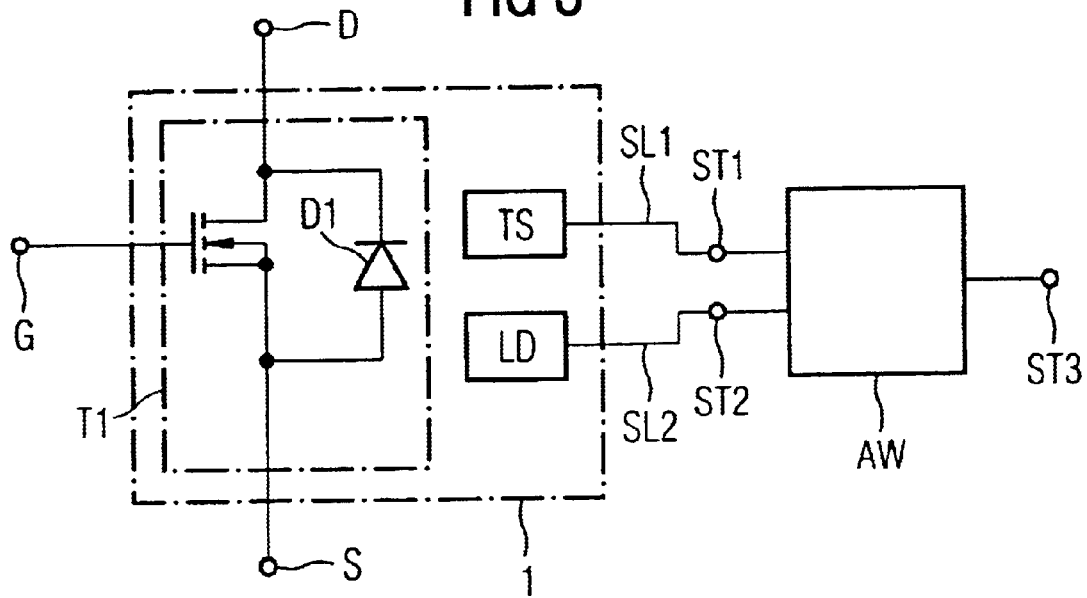
FIG. 3 shows the electrical circuit diagram associated with the semiconductor switch of FIG. 2.

FIG. 3 shows the electrical circuit diagram of the inventive temperature-protected semiconductor switch 1. The semiconductor switch element T1 is implemented as a MOSFET that, due to technology, includes an integrated reverse diode D1. The anode of the reverse diode D1 is thereby connected to the source terminal of the MOSFET, whereas the cathode is in communication with the drain terminal. Further, the semiconductor switch 1 includes the temperature sensor TS and charge carrier detector LD, both of which are connected to an evaluation means AW via a signal line SL1 or, respectively, SL2. The evaluation means AW generates a signal at a status output ST3 that derives from an operation of the signals adjacent the status outputs ST1 or, respectively, ST2.

The evaluation means thereby works as follows. It is assumed that the temperature sensor TS generates a logical H in case a predetermined temperature is upwardly exceeded. When the integrated reverse diode D1 produces free charge carriers, then a logical H is adjacent the status output ST2; otherwise, a logical L is present.

When, due to a specific operating condition, the reverse diode D1 is operated in a flow direction, then it produces free charge carriers. As a result, the temperature sensor TS responds due to a parasitic structure and generates a logical H at the status output ST1. At the same time, the charge carrier detector LD also responds so that it likewise generates a logical H at its status output ST2. In this case, the evaluation means AW generates, for example, a logical L at its status output ST3, this being equivalent to a normal operating condition.

When, due to an abnormal operating condition, the semiconductor switch T1 becomes extremely hot, then the temperature sensor TS responds and generates a logical H at the status output ST1. Since, however, the reverse diode D1 does not produce any free charge carriers in this case, a logical L remains at the status output ST2. The evaluation means AW generates a logical H at its status output ST3 from these two input signals, this being equivalent to an excess temperature. In this case, a further evaluation means (not shown) can be activated which, for example, switches the semiconductor switch 1 off or, on the other hand, activates a current limitation.

Figure 4:
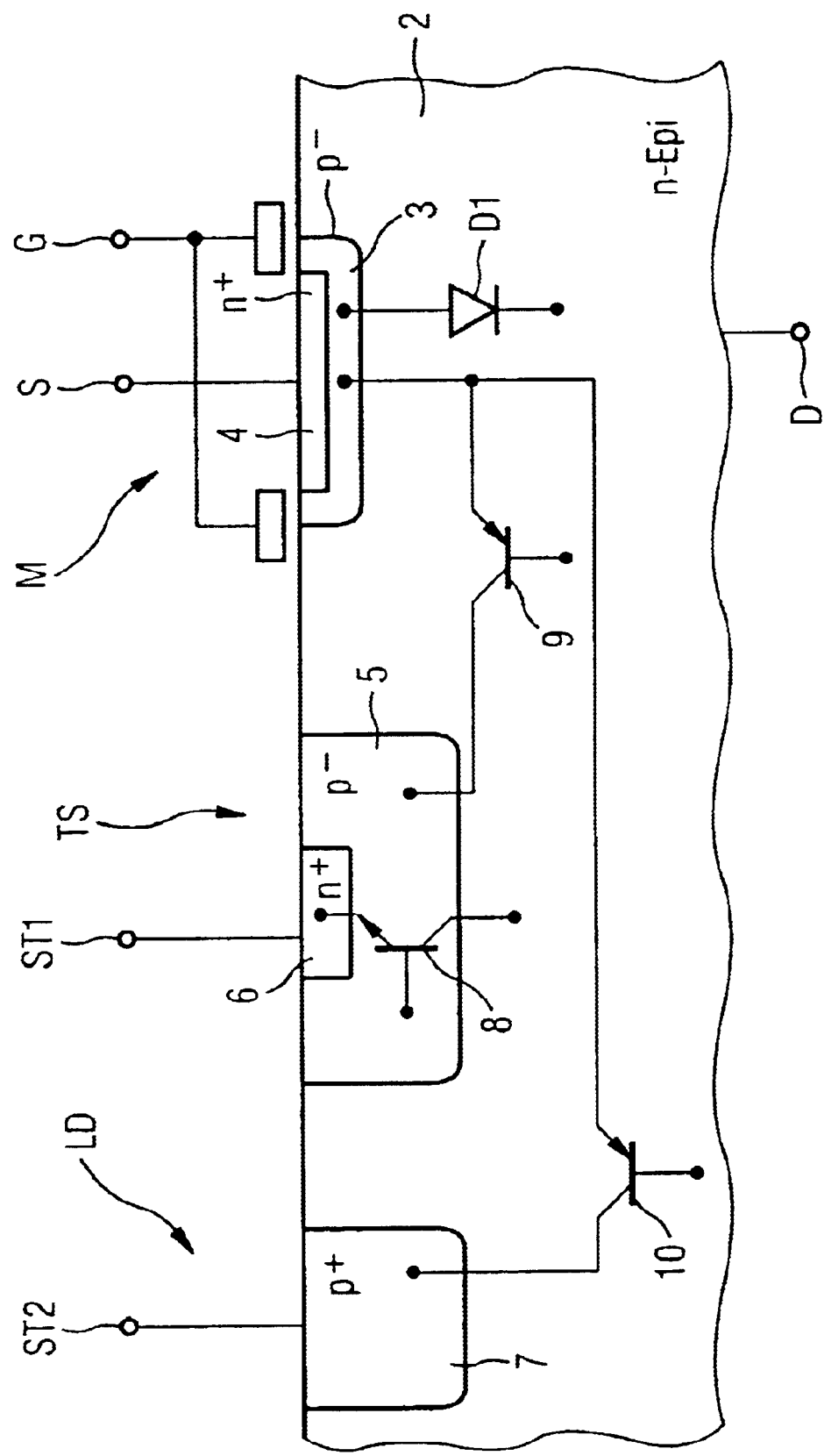
FIG. 4 shows a cross section through the semiconductor body of the temperature-protected semiconductor switch of the present invention.

FIG. 4 shows a cross section through the semiconductor body of the temperature-protected semiconductor switch 1. In order to further illustrate the functionality of the present invention, the electrical circuit symbols also are entered. A number of MOS cells M are arranged in the semiconductor body. For the sake of simplicity, only a single such MOS cell M is shown in FIG. 4. The MOS cells M, however, surround the temperature sensor TS and the charge carrier detector at all sides. The MOS cell M is arranged in a known way; i.e., a p-doped well 3 is let into the n-doped semiconductor body wherein a n-doped source zone is, in turn, arranged in the well 3. The source zone 4 is thereby electrically externally connected to a source terminal. The gate electrodes G are arranged over the p-well via a gate oxide (not shown). The n-doped semiconductor body 2 is connected to a drain contact D.

A temperature sensor TS is arranged neighboring an MOS cell M. In the present figure, this is implemented as bipolar transistor 8. To this end, a p-well 5 is let into the semiconductor body 2, and a highly n-doped layer 6 is, in turn, placed in said p-well 5. The n-doped layer 6 is connected to the signal line SL1 with the status output ST1. The npn bipolar transistor 8 is formed by this structure.

The charge carrier detector LD is arranged neighboring the temperature sensor TS and is embodied in the form of a highly p-doped well in the semiconductor body 2. The p-doped well 7 is connected to the status output ST2 via the signal line SL2.

The p-well 3 together with the n-doped semiconductor body 2 forms the technologically caused reverse diode D1. When this diode D1 is temporarily operated in flow direction, i.e. from the p-well to the semiconductor body 2, then the parasitic bipolar transistor 9, which is formed of the p-well 3, the semiconductor body 2 and the p-well 5 of the temperature sensor become simultaneously active. When, consequently, charge carriers are released from the p-well 3 to the semiconductor body 2, then a current flows into the p-well 5 via the parasitic bipolar transistor 9. This represents the base of the temperature sensor TS implemented as a bipolar transistor which, thus, produces a signal at the status output ST1 that simulates a temperature rise. At the same time, however, the parasitic bipolar transistor 10 also becomes active, this being formed of the p-well 3 of the MOS cell M, of the semiconductor body 2 and of the p-well 7 of the charge carrier detector LD. A signal is therefore generated at the status output ST2. On the basis of the suitable operation of the signals adjacent the status outputs ST1 and ST2, a true excess temperature can be distinguished in the evaluation means AW from an apparent excess temperature.

As a result this simple procedure, a very effective temperature monitoring system can be affected both in a very simple way and, above all else, in a space saving fashion. As desired, the temperature sensor can be integrated in the proximity of the hottest location of the semiconductor switch 1. The disadvantages from the above-described prior art are thus avoided. The manufacture of the inventive, temperature-protected semiconductor switch is possible with only a few modified manufacturing steps compared to a standard, temperature-protected semiconductor switch.

Although the present invention has been described with reference to specific embodiments, those of skill in the art will recognize that changes may be made thereto without departing from the spirit and scope of the invention as set forth in the hereafter appended claims.

I claim as my invention:

1. A temperature-protected semiconductor switch, comprising:
    a semiconductor body of first conductivity type;
    a semiconductor switch element formed of a plurality of cells connected in parallel and including an integrated reverse diode;
    a temperature sensor which generates a first signal given the occurrence of an excess temperature, wherein the semiconductor switch element and the temperature sensor are integrated together in the semiconductor body; and
    a charge carrier detector that generates a second signal given the occurrence of free charge carriers in the semiconductor body.

2. A temperature-protected semiconductor switch as claimed in claim 1, further comprising:
    a parasitic component formed between the charge carrier detector, the semiconductor body and it least one cell M f the semiconductor switch element.

3. A temperature-protected semiconductor switch as claimed in claim 1, further comprising:
    in evaluation means, wherein the first and second signals are supplied to the evaluation means and logically operated with one another thereat for indicating an unambiguous excess temperature in the semiconductor switch element.

4. A temperature-protected semiconductor switch as claimed in claim 1, wherein the charge carrier detector is positioned adjacent the temperature sensor.

5. A temperature-protected semiconductor switch as claimed in claim 1, wherein the temperature sensor is attached proximate a hottest location of the semiconductor body.

6. A temperature-protected semiconductor switch as claimed in claim 1, wherein the charge carrier detector is positioned adjacent a signal line of the temperature sensor leading out of the semiconductor switch.

7. A temperature-protected semiconductor switch as claimed in claim 3, wherein the evaluation means is monolithically integrated with the semiconductor switch.

8. A temperature-protected semiconductor switch as claimed in claim 1, further comprising:
    at least one of a bipolar transistor and a thyristor as the temperature sensor.

9. A temperature-protected semiconductor switch as claimed in claim 1, wherein the first conductivity type is n-conductive.

* * * * *